United States Patent [19]

Mears

[11] Patent Number: 4,832,781
[45] Date of Patent: May 23, 1989

[54] METHODS AND APPARATUS FOR THERMAL TRANSFER WITH A SEMICONDUCTOR WAFER IN VACUUM

[75] Inventor: Eric L. Mears, Rockport, Mass.

[73] Assignee: Varian Associates, Inc., Palo Alto, Calif.

[21] Appl. No.: 141,709

[22] Filed: Jan. 7, 1988

[51] Int. Cl.⁴ .......................... B44C 1/22; F28F 7/00; B29C 37/00
[52] U.S. Cl. .................................. 156/345; 118/724; 118/728; 156/643; 156/668; 165/80.5; 165/1
[58] Field of Search ............. 118/724, 725, 728; 165/1, 46, 80.5, 80.2, 185; 427/38, 39; 156/345, 643, 668, 629, 633, 656; 219/121 PY; 148/DIG. 82; 204/192.11, 192.31, 192.34, 298

[56] References Cited

U.S. PATENT DOCUMENTS

| | | | |
|---|---|---|---|
| 3,818,982 | 6/1974 | Wagner | 165/86 |
| 4,139,051 | 2/1979 | Jones et al. | 165/1 |
| 4,282,924 | 8/1981 | Faretra | 165/80 E |
| 4,457,359 | 7/1984 | Holden | 165/80 C |
| 4,535,835 | 8/1985 | Holden | 165/80 R |
| 4,580,619 | 4/1986 | Aitken | 165/1 |
| 4,682,566 | 7/1987 | Aitken | 118/724 |
| 4,724,325 | 2/1988 | Armstrong | 250/443.1 |

FOREIGN PATENT DOCUMENTS

| | | |
|---|---|---|
| 50-109596 | 8/1975 | Japan . |
| 1443215 | 7/1976 | United Kingdom . |
| 2071673 | 9/1981 | United Kingdom . |

OTHER PUBLICATIONS

G. M. Greenstein et al., "Heat Sinking Wafer Gripper," IBM Technical Disclosure Bulletin, vol. 20, No. 3, 8/77.

Primary Examiner—William A. Powell
Attorney, Agent, or Firm—Stanley Z. Cole; Gerald M. Fisher; Terrence E. Dooher

[57] ABSTRACT

Thermal transfer between a semiconductor wafer and a platen during vacuum processing is provided through a soft, thermally-conductive polymer layer having a thin, hard surface film. The soft polymer layer, which is preferably silicone rubber containing thermally-conductive particles, conforms to surface irregularities on the wafer and has low thermal resistance. The surface film is preferably silicon dioxide in the form of a multiplicity of flat plates integrally formed on the silicone rubber. Adherence of the wafer and of foreign matter to the polymer layer is prevented by the surface film. In addition, the underlying polymer layer is protected by the surface film. A high purity polymer layer is fabricated by evacuating the mold cavity and the resin container prior to injection of resin. The mold for the polymer layer utilizes a hard, smooth mold release surface and a resilient gasket between the platen and the mold release surface. The gasket establishes the dimensions of the polymer layer and seals the mold cavity. The surface film is formed by oxygen plasma treatment of the silicone rubber layer.

61 Claims, 5 Drawing Sheets

METHODS AND APPARATUS FOR THERMAL TRANSFER WITH A SEMICONDUCTOR WAFER IN VACUUM

FIELD OF THE INVENTION

This invention relates to processing of semiconductor wafers in a vacuum chamber and, more particularly, to methods and apparatus for transferring thermal energy to or from a semiconductor wafer in vacuum utilizing a soft, thermally-conductive silicone rubber layer having a smooth, nonstick surface film comprising a plurality of plates.

BACKGROUND OF THE INVENTION

In the fabrication of integrated circuits, a number of well-established processes involve the application of ion beams to semiconductor wafers in vacuum. These processes include ion implantation, ion beam milling and reactive ion etching. In each instance, a beam of ions is generated in a source and is directed with varying degrees of acceleration toward a target wafer. Ion implantation has become a standard technique for introducing impurities into semiconductor wafers.

The energetic ions in an ion beam applied to a semiconductor wafer generate heat in the wafer. This heat can become significant, depending on the energy level and current level of the ion beam and can result in uncontrolled diffusion of impurities beyond prescribed limits in the wafer. A more severe problem with heating is the degradation of patterned photoresist layers which are often applied to semiconductor wafers before processing and which have relatively low melting points.

Other semiconductor wafer processes such as ion etching, sputter deposition and etching, ion beam deposition, vacuum evaporation, plasma etching and chemical vapor deposition are performed in vacuum and may result in undesired heating of the wafer. In some instances, the process may require heat to be transferred to the wafer.

In commercial semiconductor processing, a major objective is to achieve a high throughput in terms of wafers processed per unit time. One way to achieve high throughput is by automation of the process for increased speed, reduced human handling of wafers, and more uniform and particulate-free devices. Another way to achieve high throughput in the case of an ion beam system is to use a relatively high current beam so that the desired process is completed in a shorter time. However, large amounts of heat are likely to be generated in the wafers being processed. Thus, it is necessary to provide wafer cooling in order to prevent the above-described detrimental effects of elevated temperatures.

A serious difficulty in effecting thermal transfer in vacuum is that thermal energy is blocked from conduction through a vacuum. The rate of thermal transfer from a semiconductor wafer by radiation is inadequate for most processes. Therefore, to achieve adequate rates of thermal transfer by conduction, it is necessary to physically contact the wafer with a thermally-conductive medium coupled to a heat sink. Although such a system is straightforward in principle, efficient wafer cooling for automated ion implantation systems has been difficult to achieve for a number of reasons.

Since the front of the wafer must be exposed for ion beam treatment, any clamping must be at the periphery or by centrifugal force. Direct solid-to-solid contact between a wafer and a flat metal heat sink is relatively ineffective since any bowing or irregularities in the back surface of the wafer result in regions where the wafer does not contact the heat sink surface. Furthermore, where contact does occur, microscopic voids in the wafer and heat sink surfaces result in actual physical contact occurring over only about five percent of the two surfaces. As a result, thermal transfer is poor. A contoured heat sink surface for optimizing conductive heat transfer between a wafer and a heat sink is disclosed in U.S. Pat. No. 4,535,835, issued Aug. 20, 1985 to Holden. The heat sink surface is contoured so as to impose a load that results in a uniform contact pressure distribution and a stress approaching the elastic limit of the wafer for a peripherally clamped wafer.

Other techniques for limiting wafer temperature during processing have included batch processing in which the incident ion beam is time-shared over a number of wafers so that the heating on any particular wafer is limited. A thermally-conductive fluid can be confined by a flexible diaphragm which contacts the back of the wafer as disclosed in U.S. Pat. Nos. 4,580,619 issued Apr. 8, 1986 to Aitken and 4,682,566 issued July 28, 1987 to Aitken.

The technique of gas conduction has also been utilized for wafer cooling in vacuum. Gas is introduced into a cavity behind a semiconductor wafer and effects thermal coupling between the wafer and a heat sink. Gas-assisted solid-to-solid thermal transfer with a semiconductor wafer is disclosed in U.S. Pat. No. 4,457,359 issued July 3, 1984 to Holden. A semiconductor wafer is clamped at its periphery onto a shaped platen. Gas under pressure is introduced into the microscopic void region between the platen and the wafer. The gas pressure approaches that of the preloading clamping pressure without any appreciable increase in the wafer-to-platen spacing, thereby reducing the thermal resistance. When gas conduction cooling is utilized, it is necessary to confine the gas to the region behind the wafer and to prevent escape of the gas into the vacuum chamber, since gas escaping into the vacuum chamber is likely to have detrimental effects on the process being performed.

Another prior art technique for thermal transfer in vacuum involves the use of a thermally-conductive polymer between a semiconductor wafer and a heat sink. A tacky, inert polymer film for providing thermal contact between a wafer and a heat sink is disclosed in U.S. Pat. No. 4,139,051 issued Feb. 13, 1979 to Jones et al. The polymer film disclosed by Jones et al has a sticky surface which is used to advantage to retain the wafer in position during processing. However, such a sticky surface is unacceptable in automated processing, wherein the wafer must easily be removed after ion beam treatment. The use of sticky surfaces in automated equipment often results in wafer breakage during wafer removal, or in an inability to remove the wafer from the sticky surface at all. Furthermore, particles, dust and other undesired materials tend to adhere to the sticky polymer surface and to contaminate subsequent wafers. In addition, cleaning of foreign matter from the sticky surface is difficult.

An automated wafer clamping mechanism utilizing a pliable thermally-conductive layer between a semiconductor wafer and a heat sink is disclosed in U.S. Pat. No. 4,282,924 issued Aug. 11, 1981 to Faretra. The wafer is clamped at its periphery to a convexly-curved platen having a layer of thermally-conductive silicone rubber on its surface. The Faretra apparatus has provided satisfactory thermal transfer under a variety of conditions. However, sticking of wafers to the silicone rubber surface has occasionally been a problem. To limit such sticking, relatively hard silicone rubbers have been utilized. However, the relatively hard silicone rubber is less effective with respect to thermal transfer, and intimate contact between the wafer and the convexly curved silicone rubber surface is not always achieved.

A technique for modifying the surface of a polymeric material utilizing ion implantation of selected ions is disclosed in British Patent Application No. 2,071,673A, published Sept. 23, 1981. However, the British publication contains no disclosure of a technique for preventing stickiness on polymer surfaces.

Imperfections and gas bubbles in the silicone rubber or other polymer layer can seriously degrade thermal transfer performance. When a gas bubble that is present during the molding process leaves a void on the surface of the silicone rubber layer, thermal transfer is reduced in the area of the void. When gas bubbles are located within the bulk of the silicone rubber layer, they can gradually outgas during vacuum processing, thereby causing a virtual leak in the vacuum chamber. It has been difficult to achieve a silicone rubber layer that is uniform and free of gas bubbles.

While the curved platens disclosed in U.S. Pat. Nos. 4,535,835 and 4,282,924 increase the area of contact between the wafer and the thermally-conductive surface, they introduce a spatial variation in angle between the incident ion beam and the wafer surface. In some processes such as ion implantation, angle-of-incidence variations can be a serious problem. The depth of penetration of incident ions is a function of incident angle because of the well-known channeling effect. Therefore, it is desirable in ion implantation to provide a constant angle-of-incidence between the ion beam and the wafer surface over the surface area of the semiconductor wafer.

It is a general object of the present invention to provide improved apparatus for effecting thermal transfer with a workpiece in vacuum.

It is another object of the present invention to provide a thermally-conductive polymer layer for effecting highly efficient thermal transfer between a semiconductor wafer and a heat sink or a heat source.

It is a further object of the present invention to provide a thermally-conductive polymer layer having a nonstick surface for thermal transfer with a semiconductor wafer.

It is still another object of the present invention to provide apparatus for thermal transfer with a semiconductor wafer wherein the wafer is maintained substantially flat during processing.

It is still another object of the present invention to provide apparatus for thermal transfer with a semiconductor wafer, including a thermally-conductive polymer layer having a thin surface film which substantially prevents adherence of the wafer.

It is a further object of the present invention to provide apparatus for effectively cooling a semiconductor wafer during processing in vacuum so as to permit a relatively high level of incident energy.

It is a further object of the present invention to provide apparatus for thermal transfer with a semiconductor wafer, which is simple in construction and low in cost.

It is another object of the present invention to provide apparatus for thermal transfer with a semiconductor wafer, including a thermally-conductive polymer layer having an extremely smooth surface for enhanced thermal transfer.

It is still another object of the present invention to provide apparatus for thermal transfer with a semiconductor wafer, including a thermally-conductive polymer layer that is very soft so as to conform to surface irregularities of the semiconductor wafer.

It is another object of the present invention to provide an improved method for effecting thermal transfer with a workpiece in vacuum.

It is another object of the present invention to provide a method of treating a thermally-conductive polymer layer used for thermal transfer with a semiconductor wafer to prevent adherence of the wafer to the polymer layer.

It is yet another object of the present invention to provide apparatus for thermal transfer with a semiconductor wafer including a thermally-conductive polymer layer having a thin surface film comprising a plurality of plates.

SUMMARY OF THE INVENTION

According to the present invention, these and other objects and advantages are achieved in apparatus for effecting thermal transfer with a workpiece, such as a semiconductor wafer, in vacuum comprising a thermally-conductive platen including a heat transfer surface, a first thermally-conductive layer affixed to the heat transfer surface for conforming to the shape of a surface of the workpiece, and a second thermally-conductive layer that is thin relative to the first layer, affixed to the first layer and having a smooth surface for contacting the workpiece without adhering thereto.

The first layer is typically a thermally-conductive polymer layer, and is preferably silicone rubber having thermally-conductive particles dispersed therein and having a hardness characterized by a durometer value less than about 20 Shore A. The second layer is preferably an oxide surface film formed by oxygen plasma treatment of the silicone rubber layer.

The first and second layers conform to irregularities on the back surface of the semiconductor wafer and provide excellent contact between the wafer and the second layer. The second layer is extremely smooth so as to provide uniform contact over the area of the semiconductor wafer and has little or no tendency to adhere to the wafer, thereby facilitating automated wafer processing and handling. Preferably, the second layer is fractured into a plurality of plate-like members which individually conform to the back surface of the wafer and further enhance intimate contact therebetween.

According to another aspect of the present invention, there is provided a method for effecting thermal transfer with a workpiece, such as a semiconductor wafer. The method comprises the steps of providing a thermally-conductive platen having a heat transfer surface, affixing a soft, thermally-conductive polymer layer to the heat transfer surface, forming on the polymer layer a thin surface film for contacting the workpiece without adhering thereto, and pressing the workpiece into contact with the surface film. Preferably, the step of forming the surface film includes the step of oxygen plasma treatment of the polymer layer sufficient to form an oxide surface film having a thickness in the range of 0.1 to 5.0 micrometers.

According to yet another aspect of the invention, there is provided a method for treating a thermally-conductive polymer layer used for thermal transfer with a semiconductor wafer to prevent adherence of the wafer to the polymer layer. The method comprises the step of forming a thin surface film on the polymer layer, the surface film being harder than the polymer layer. Preferably, the polymer layer comprises silicone rubber having thermally-conductive particles dispersed therein, and the step of forming a surface film includes the step of oxygen plasma treatment of the silicone rubber to form an oxide surface film.

BRIEF DESCRIPTION OF THE DRAWINGS

For a better understanding of the present invention together with other and further objects, advantages and capabilities thereof, reference is made to the accompanying drawings which are incorporated herein by reference and in which.

DETAILED DESCRIPTION OF THE INVENTION

Figure 1A:
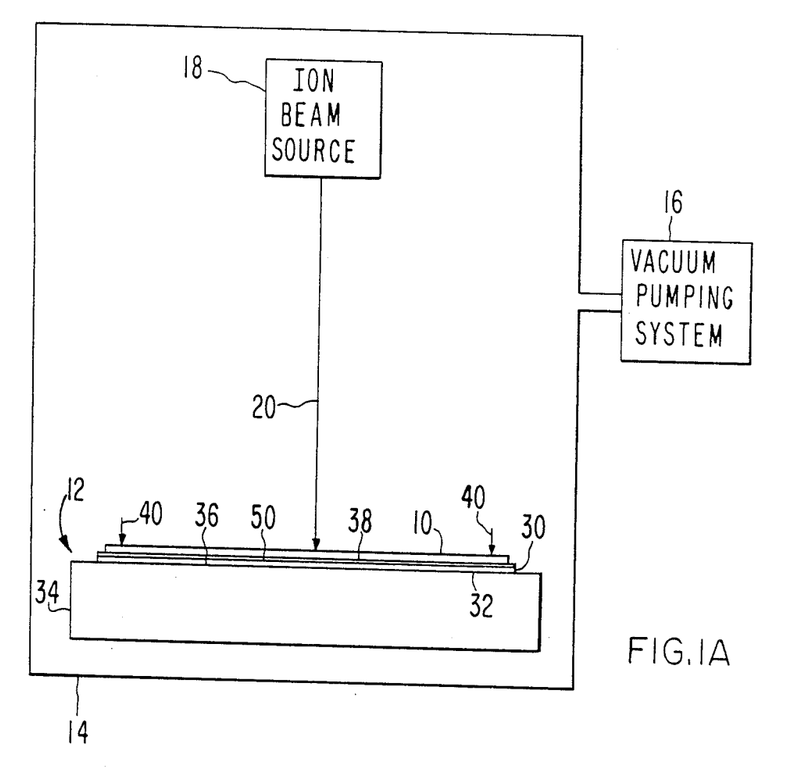
FIG. 1A is a schematic block diagram of a vacuum processing system utilizing thermal transfer apparatus in accordance with the present invention.

A block diagram of a vacuum processing system utilizing thermal transfer apparatus is shown in FIG. 1A. A semiconductor wafer 10 is mounted on thermal transfer apparatus 12. The wafer 10 and the thermal transfer apparatus 12 are positioned in a chamber 14 that is evacuated to a specified pressure range by a vacuum pumping system 16. An ion beam source 18 directs an ion beam 20 at the wafer 10 for implantation of impurity dopants, etching, or some other desired function and causes undesired heating thereof. The system illustrated in FIG. 1A can represent an ion implantation system, a reactive ion etch system or any other processing system which utilizes an ion beam for treating the semiconductor wafer 10.

When the system is an ion implantation system, the ion beam 20 from source 18 is mass analyzed and focused to produce a well-defined beam of a desired ion species. Relative movement of the ion beam 20 and the wafer 10 by electrostatic or magnetic deflection of beam 20, by mechanical movement of wafer 10, or by a combination thereof produces a uniform ion dose distribution over the wafer surface. Most ion implantation systems fall into two general categories: (1) serial systems which utilize electrostatic beam deflection and which process one or two wafers at a time; and (2) batch systems in which up to 25 wafers are mounted on a rotating disk and the beam is scanned over the rotating disk by magnetic deflection of the beam or by mechanical translation of the rotating disk. In either type of system, the thermal energy imparted to the wafers by the ion beam 20 can be significant and must be removed by a carefully designed wafer cooling system.

In automated systems, the wafer or wafers are positioned in a target chamber which can be isolated from the main beamline to facilitate rapid vacuum pumping. An end station including an automatic wafer transfer system introduces semiconductor wafers into target positions in the target chamber, aligns the wafers with respect to a target plane, provides cooling of the wafers during implantation and removes the wafers from the target chamber after implantation is complete. At each target position, means must be provided for retaining the wafer in position during implantation and for cooling the wafer. A serial system has one or two target positions, while a batch system has multiple target positions.

The thermal transfer apparatus 12 at each target position includes a thermally-conductive layer 30 affixed to a heat transfer surface 32 of a platen 34. While the layer 30 can be any suitable thermally-conductive material, it is typically a polymer layer. The polymer layer 30 is formed of a resilient material, such as an elastomer, that conforms to surface irregularities on the wafer 10 and then returns to its original shape after the wafer 10 is removed. Although the polymer layer 30 can be formed separately, it typically is molded in place on heat transfer surface 32. The polymer layer 30 is soft to enhance thermal transfer and has a thin, platelike surface layer or film 50 that is harder than polymer layer 30 to prevent adherence to the wafer 10, as described in detail hereinafter. The semiconductor wafer 10 is pressed into intimate contact with a front surface 38 of surface film 50 by a force 40 that is preferably maximized. For centrifugal clamping as described below, the force 40 is typically about 0.02 lbs/cm$^2$. Thermal energy imparted to the wafer 10 by ion beam 20 is transferred by conduction through surface film 50 and polymer layer 30 to platen 34 and is removed by appropriate cooling means.

Figure 1B:
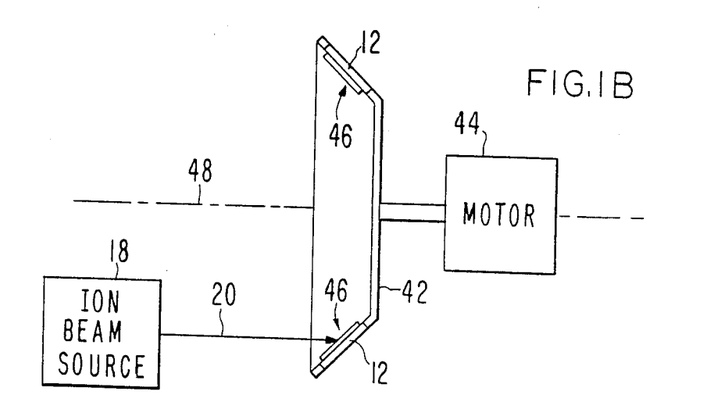
FIG. 1B is a block diagram illustrating a rotating disk for centrifugal clamping of wafers during ion implantation.

Preferably, the force 40 that presses wafer 10 into contact with surface film 50 is a centrifugal force resulting from rotation of the thermal transfer apparatus 12 about a prescribed axis. As shown in FIG. 1B, the thermal transfer apparatus 12 is mounted on a disk 42 that is rotated by a motor 44. Wafer mounting sites 46 are positioned around the periphery of disk 42, and thermal transfer apparatus 12 is provided at each site 46. Each wafer site 46, including thermal transfer apparatus 12, is tilted relative to an axis of rotation 48 so as to provide a centrifugal force tending to press wafer 10 into contact with surface film 50. The apparatus of FIG. 1A has the advantage that the entire wafer surface is exposed for treatment by ion beam 20, and no wafer area is lost because of peripheral clamping rings. In addition, the wafer is flat so that the angle of incidence of ion beam 20 is constant over the wafer surface.

Alternatively, peripheral clamping of wafer 10 can be utilized, as known in the prior art. When peripheral clamping is utilized, it is usually desirable to provide a contoured surface, as described in U.S. Pat. Nos.

4,282,924 and 4,457,359, to insure contact between the wafer and the surface film 50 over the surface area of the wafer.

The platen 34 is typically aluminum or another thermally conductive material and is preferably liquid cooled to increase the rate of thermal transfer. Liquid cooling may be provided by coolant passages (not shown) in the body of platen 34, by tubes (not shown) mounted on the back surface of platen 34 for the circulation of a liquid coolant, or by any other conventional cooling means.

Figure 2:
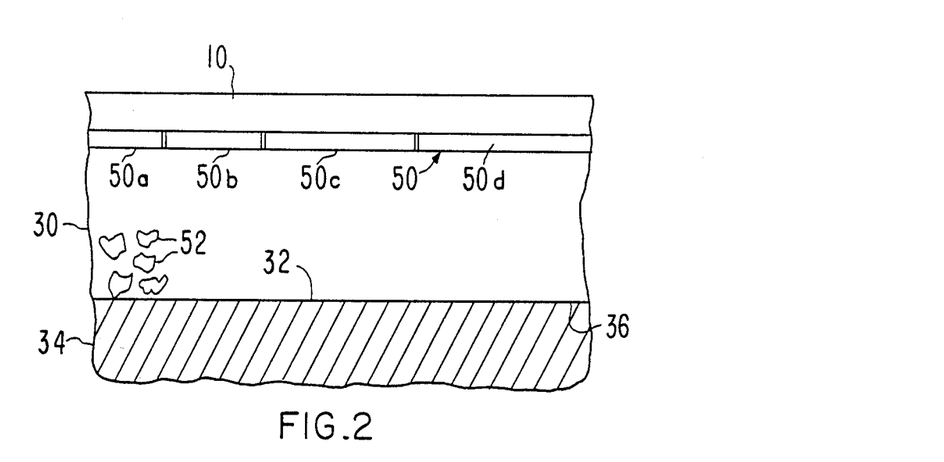
FIG. 2 is an enlarged, partial cross-sectional view of a semiconductor wafer and the thermal transfer apparatus of FIG. 1A.

An enlarged partial cross-sectional view of the thermal transfer apparatus 12 is shown in FIG. 2. The back surface 36 of polymer layer 30 becomes adhered to heat transfer surface 32 of platen 34 during the molding process described hereinafter. The polymer layer 30 is very soft in order that both surface film 50 and polymer layer 30 may conform to irregularities on the back surface of wafer 10 and to any undesired foreign matter between wafer 10 and surface film 50. In one preferred embodiment, the polymer layer 30 is a silicone rubber containing thermally conductive particles 52 which can be aluminum oxide, graphite or carbon, or any other suitable thermally-conductive material. The thermally-conductive particles preferably have a cross-sectional dimension on the order of 40 micrometers or less. As noted above, the silicone rubber is extremely soft and preferably has a hardness of durometer value 20 Shore A or less.

Prior art thermally-conductive silicone rubber layers were typically fabricated with a hardness of durometer value in the range of 50 to 70 Shore A to limit wafer sticking, or adherence, to the silicone rubber layer, since it was known that soft silicone rubber layers were stickier than hard ones. In accordance with the present invention, the problem of sticky silicone rubber surfaces is overcome by providing thin surface film 50, which is hard relative to underlying polymer layer 30, on the front surface of polymer layer 30. The surface film 50 is an extremely smooth surface that does not adhere to the back of wafer 10 and that provides very uniform and intimate contact with the back of wafer 10. In a preferred embodiment, the surface film 50 is an oxide formed by oxygen plasma treatment of the silicone rubber as described hereinafter. The oxide film has a probable composition of $SiO_2$, or quartz, which is contiguous with the bulk of the silicone rubber layer. The surface film 50 may be a single contiguous film, but usually takes the form of a multiplicity of flat plates, for example plates 50a, 50b, 50c, 50d, having dimensions varying from about 5 to 1,000 micrometers across, depending on the mechanical stress or thermal stress applied to the surface film 50 during or after fabrication of the thermal transfer apparatus. Each flat plate 50a, 50b, 50c, 50d has a smooth top surface. In this embodiment, the surface film 50 has a selected thickness in the range of 0.1 to 5 micrometers, while the polymer layer 30 has a selected thickness in the range of 0.001 inch to 0.020 inch. Preferably, the surface film 50 is a factor of at least 10 harder than polymer layer 30, and polymer layer 30 is at least 50 times thicker than surface film 50.

The surface film 50 contacts the back side of the wafer 10 and conforms to the wafer because each of the plates 50a, 50b, 50c, etc. is free to float on the soft, flexible polymer layer 30 below it. The hard surface film 50 is resistant to mechanical abrasion and damage because of the inherent hardness and strength of quartz. Adherence to the wafer is also eliminated because the quartz surface separates the sticky silicone rubber from the wafer 10. Soft polymer layers exhibit inherently weak tensile strengths and, therefore, tend to crumble into particles quite readily. The hard surface film 50 protects the soft polymer layer and reduces the tendency for crumbling. Cleaning of soft polymer layers is normally difficult because of the tendency of particles and other contaminants to stick to the surface and to become embedded in the soft polymer material. This problem is also overcome by the presence of the hard surface film 50. In addition, the surface film 50 protects the soft polymer layer from damage by the ion beam when no wafer is present on the apparatus. Thus, the invention combines the benefits of soft elastomer cooling with the easy release, cleanliness and durability of harder substrates.

The thermal transfer apparatus 12 has been described thus far in connection with wafer cooling; that is, removal of thermal energy imparted to semiconductor wafer 10 by ion beam 20 or another energy source. It will be understood that the thermal transfer apparatus 12 can be utilized for wafer heating as well as for wafer cooling. Sputter coating is an example of a vacuum process where it is sometimes desirable to heat semiconductor wafers during processing. When heating is desired, the platen 34 is raised in temperature, and thermal energy is transferred through polymer layer 30 and surface film 50 to semiconductor wafer 10.

Figure 3:
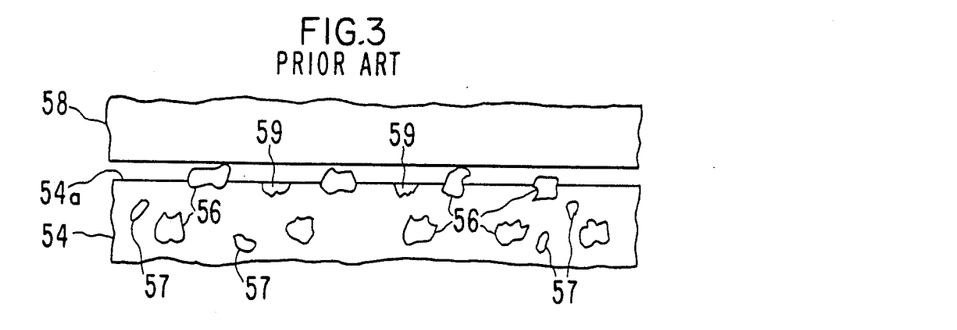
FIG. 3 is an enlarged, partial cross-sectional view of a polymer layer and a wafer in accordance with the prior art.

As noted hereinabove, the rate of thermal transfer from semiconductor wafers to prior art polymer layers has been limited. It has been found that this limitation is due in part to lack of contact between the wafer and the prior art polymer surface as shown in FIG. 3, which is greatly enlarged for ease of understanding. A prior art polymer layer 54 includes thermally-conductive particles 56. At least some of the particles 56 protrude above front surface 54a of polymer layer 54. As a result, when a wafer 58 is positioned on polymer layer 54, the protruding particles 56 prevent good contact with surface 54a and limit the rate of thermal transfer by conduction.

Prior art polymer layer 54 also includes voids or trapped gas bubbles 57, which reduce the thermal transfer rate and which can outgas during vacuum processing, and surface cavities 59 which reduce the area of contact between wafer 58 and front surface 54a and thereby also reduce the rate of thermal transfer.

Figure 4:
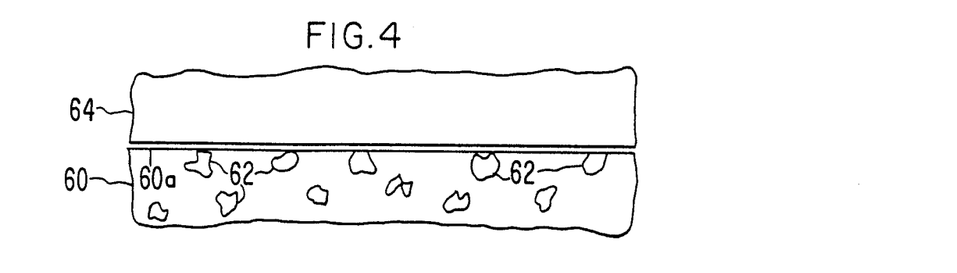
FIG. 4 is an enlarged, partial cross-sectional view of a polymer layer and a semiconductor wafer in accordance with the present invention.

It has been found that the protrusion of thermally-conductive particles above the surface of the polymer layer can be eliminated by fabricating the polymer layer in a mold in which careful attention is given to the mold surface that defines the upper, or wafer-contacting, surface of polymer layer 30. This mold surface is provided with a mold release material that is very smooth, preferably optically flat, and is sufficiently hard to prevent thermally-conductive particles from protruding above the wafer-contacting surface of polymer layer 30 during molding thereof. Prior art molding techniques utilized relatively soft mold-release materials such as grease, oil or wax. As shown in FIG. 4, which is greatly enlarged for ease of understanding, a polymer layer 60 includes thermally-conductive particles 62. Any particles 62 near surface 60a during the molding process are pressed into the bulk of the polymer layer 60 until curing is complete, thereby providing a smooth surface without protruding particles 62. As a result, a wafer 64 positioned on polymer layer 60 is in contact with surface 60a over virtually all of its back surface, and the rate of thermal transfer by conduction is greatly increased in comparison with prior art configurations. In FIG. 4, wafer 64 is shown slightly displaced above polymer layer 60 in order to illustrate that particles 62 do not protrude above the top surface of polymer layer 60. As described hereinafter, the mold release surface can be glass, hardened stainless steel, polyester film or any other material on which a smooth surface can be formed, which does not adhere to the polymer during molding and which is sufficiently hard to prevent protrusion of thermally-conductive particles during molding.

In the fabrication of silicone rubber layer 30, it is necessary to produce an extremely smooth surface which is free of protruding, thermally-conductive particles or other particles and which is free of surface cavities 59 caused by gas bubbles present during the molding process. Any such particles or cavities can reduce the rate of thermal transfer between the wafer and the silicone rubber layer. In addition, it is necessary that the bulk of the silicone rubber layer be free of trapped gas bubbles 57. Such trapped gas bubbles not only reduce the thermal transfer capability of the layer, but also outgas when the silicone rubber layer is placed in vacuum, thereby causing a virtual leak in the processing chamber. Therefore, the polymer layer 30 should be very pure and free of gas bubbles and other foreign matter.

Figure 5A:
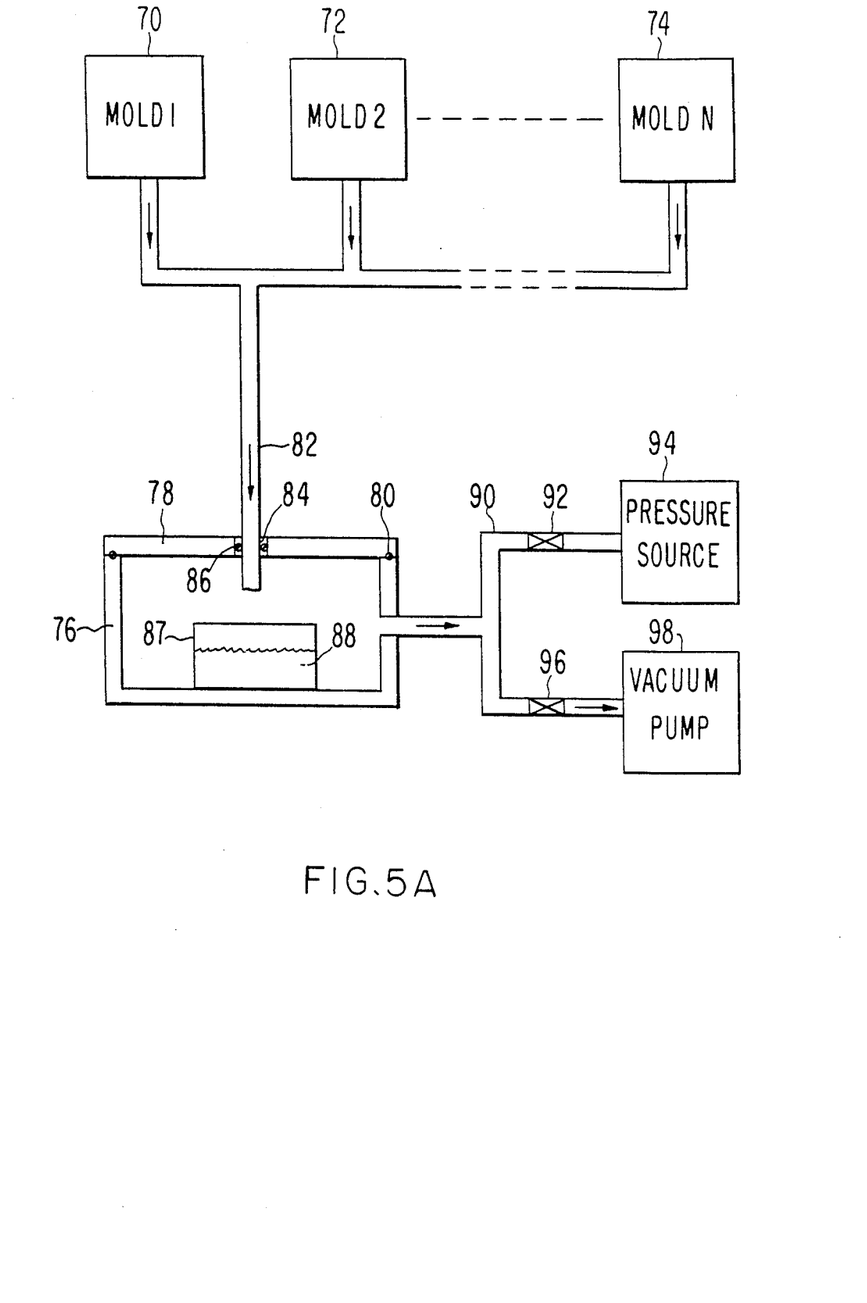
FIG. 5A is a block diagram of molding apparatus in accordance with the present invention shown during evacuation of the apparatus.
Figure 5B:
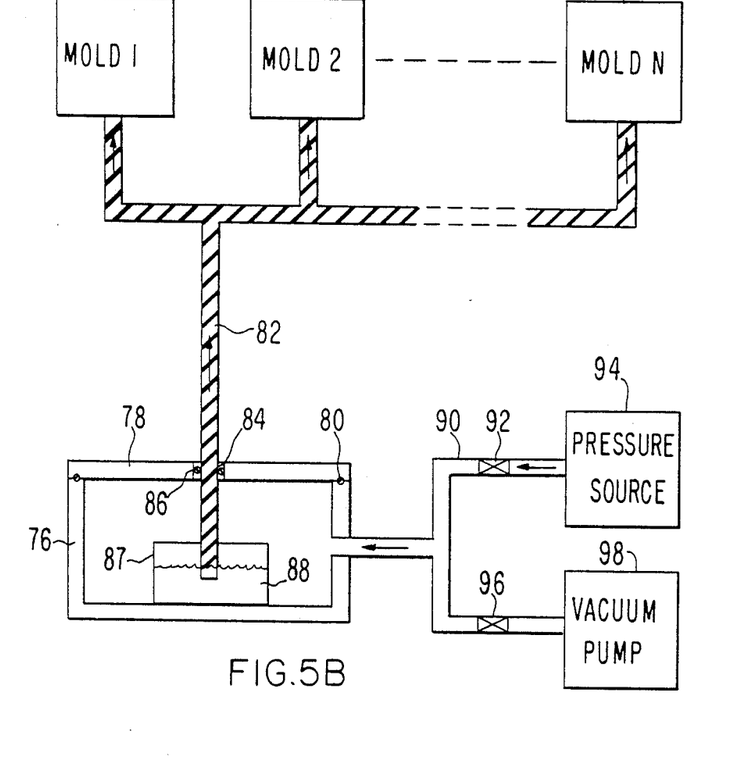
FIG. 5B is a block diagram of molding apparatus in accordance with the present invention shown during injection of polymer resin into the mold cavities.
Figure 6:
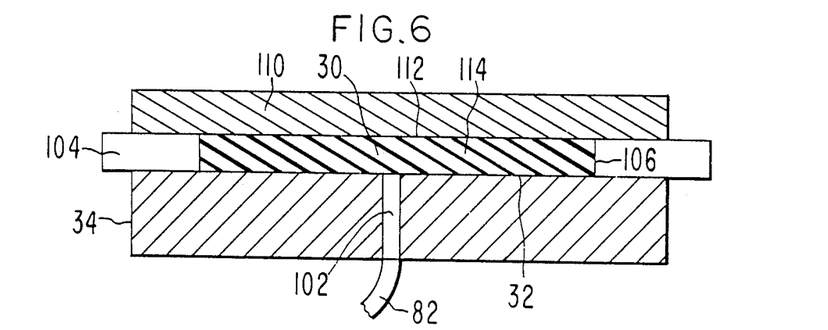
FIG. 6 is a cross-sectional view of a mold for fabricating a polymer layer.

Apparatus for molding the polymer layer 30 is illustrated in block diagram form in FIGS. 5A and 5B. A preferred mold structure is illustrated in FIG. 6. The apparatus of FIGS. 5A and 5B can be utilized to fabricate polymer layers 30 for one or more wafer sites. A mold 70 is utilized for forming the polymer layer 30 on aluminum platen 34. Molds 72 and 74 are utilized for forming additional polymer layers on additional platens (not shown) in a single molding process. The molds 70, 72, 74 are sealed vacuum-tight. A container 76 is sealed utilizing a cover 78 and an O-ring 80. A tube 82 passes through an opening 84 in cover 78 and is connected to a mold cavity (not shown in FIG. 5A) in each of molds 70, 72, 74. The tube 82 is sealed to cover 78 by an O-ring 86. Preferably, the tube 82 is flexible and is disposable after each molding process.

Within container 76 is a vessel 87 which contains a liquid resin 88 used to form the polymer layer 30. Typically, the resin 88 is formed as a mixture of two or more reacting components which are kept separate until the fabrication procedure begins. As used herein, the term "resin" is used to refer to the liquid form of the polymer layer prior to curing, in which form it can be pumped or injected into a mold. It will be understood that the resin 88 can be placed in the container 76 without using vessel 87. However, a separate vessel 87 provides the capability to keep the container 66 clean and to easily replace the resin 88 when desired.

The sealed container 76 is coupled by a conduit 90 through a valve 92 to a pressure source 94. The pressure source 94 can be an air pump or other means for pressurizing the container 76 to a desired pressure level of about 5 lbs/in². The container 76 is also coupled by conduit 90 through a valve 96 to a vacuum pump 98 which provides the capability to evacuate the sealed container 76 to a pressure level of about 1 torr.

The tube 82 is coupled vacuum-tight to one or more molds 70, 72, 74 and the end of tube 82 within container 76 is positioned outside the liquid resin 88. Valve 92 is closed and valve 96 is opened, causing vacuum pump 98 to evacuate both the sealed container 76 and the mold cavities in molds 70, 72, 74 as shown in FIG. 5A. The reduction in pressure in sealed container 76 promotes outgassing of gas bubbles in liquid resin 88, thereby providing a uniform and gas-free material.

Next, the end of tube 82 within container 76 is lowered below the surface of liquid resin 88 by sliding the tube 82 through O-ring 86, valve 96 is closed and valve 92 is opened. Pressure source 94 provides the prescribed pressure within container 76, causing liquid resin 88 to be forced through tube 82 into still-evacuated mold cavities in molds 70, 72, 74 as shown in FIG. 5B. Since the mold cavities have been evacuated and the liquid resin 88 has been outgassed, the mold cavities are filled with liquid resin 88 which is substantially free of trapped gas bubbles. The resin 88 in the mold cavities is allowed to cure, either at room temperature or at an elevated temperature, to provide the polymer layer. The polymer layer formed by this process is highly uniform and free of surface cavities and trapped gas bubbles.

The details of one embodiment of the molds 70, 72, 74 are illustrated in FIG. 6. The aluminum platen 34, on which the silicone rubber layer is to be formed, is provided with a hole 102 between heat transfer surface 32 and the opposite surface. A flexible, resilient gasket 104 having an opening 106 is positioned on the heat transfer surface 32. The gasket 104 has a thickness equal to the desired thickness of the polymer layer, and the opening 106, typically circular, has a diameter equal to the desired diameter of the polymer layer. Preferably, the gasket 104 is formed of polyurethane. Then, an upper mold member 110, having a mold release surface 112, is placed over gasket 104 so as to form a sealed mold cavity 114 which defines the size and shape of the polymer layer to be molded.

As noted hereinabove, mold release surface 112 can be glass, hardened stainless steel, polyester film or another material having sufficient hardness to prevent thermally-conductive particles in resin 88 from protruding above the surface of the polymer layer, while avoiding adherence of the polymer layer thereto during curing. Preferably, the mold release surface 112 is made optically flat. When necessary, a mold release material in the form of an aerosol spray can be applied to mold release surface 112. A preferred aerosol spray is Teflon having particle sizes in the range of 1-5 micrometers. In one preferred embodiment, the mold release surface 112 can be a polyester film which transfers to polymer layer 30 during molding and which is retained on the polymer layer 30 after molding for protection during the remainder of the system assembly and test procedure. The polyester film is subsequently removed by peeling it from the polymer layer 30. The use of a resilient gasket 104 seals the mold cavity 114 and defines the thickness and the diameter of the polymer layer 30, while preventing flashing (leakage between the mold elements) and other irregularities at the peripheral edge of the polymer layer.

The tube 82 from sealed container 76 is coupled by a suitable vacuum-tight fitting (not shown) of conventional construction through hole 102 to mold cavity 114 for evacuation and subsequent filling of mold cavity 114 as described hereinabove. The resin in mold cavity 114 is allowed to cure, typically at room temperature. Subsequent to curing, the mold member 110 and gasket 104 are removed from platen 34, leaving soft polymer layer 30 adhered to the heat transfer surface 32.

Next, the platen 34 and the polymer layer 30 are placed in a plasma etcher such as a Drytek etcher commonly used to remove photoresist from wafers. The chamber of the etcher is evacuated and oxygen is introduced into the chamber at a pressure level of about 400 microns. Radio frequency energy at a level of about one kilowatt is applied to the oxygen by the etcher so as to form an oxygen plasma in the chamber. While the platen 34 and the polymer layer 30 are not intentionally heated, the applied radio frequency energy raises their temperature to about 100° C. The platen 34 and the polymer layer 30 are left in the oxygen plasma for about 30 minutes, causing formation of the thin, relatively hard surface film 50 on polymer layer 30. The oxygen plasma treatment of the polymer layer 30 produces an extremely clean surface. In addition, the oxygen reacts with the silicon in the silicone rubber to form a silicone dioxide, or quartz, layer, preferably having thickness in the range of 0.1 to 5.0 micrometers. The thickness of the quartz layer depends on the oxygen plasma treatment time. Since silicone rubber consists of hydrogen, carbon and silicon, it is believed that the oxygen plasma erodes the hydrogen and carbon from the upper portion of the silicone rubber layer to form $H_2O$ and $CO_2$, leaving an upper layer of almost pure silicon. This silicon then reacts with the oxygen in the plasma to form the oxide layer. It is further believed that oils in the rubber bubble up during the oxygen plasma treatment and react with the oxygen to form silicon dioxide.

It has been found that the oxide (quartz) surface film 50 is easily fractured into multiple plates varying in dimension from about 5 to 1,000 micrometers across. The plates can be created by applying a mechanical stress, a thermal stress or a combination thereof to the film 50. The quartz plates do not flake off the silicone rubber surface since they are formed as an integral part of it. Since each of the multiple plates moves independently, they conform to surface irregularities on the back of the wafer and to particles inadvertently trapped between the wafer and the polymer layer. As a result, cooling performance is substantially enhanced.

Figure 7:
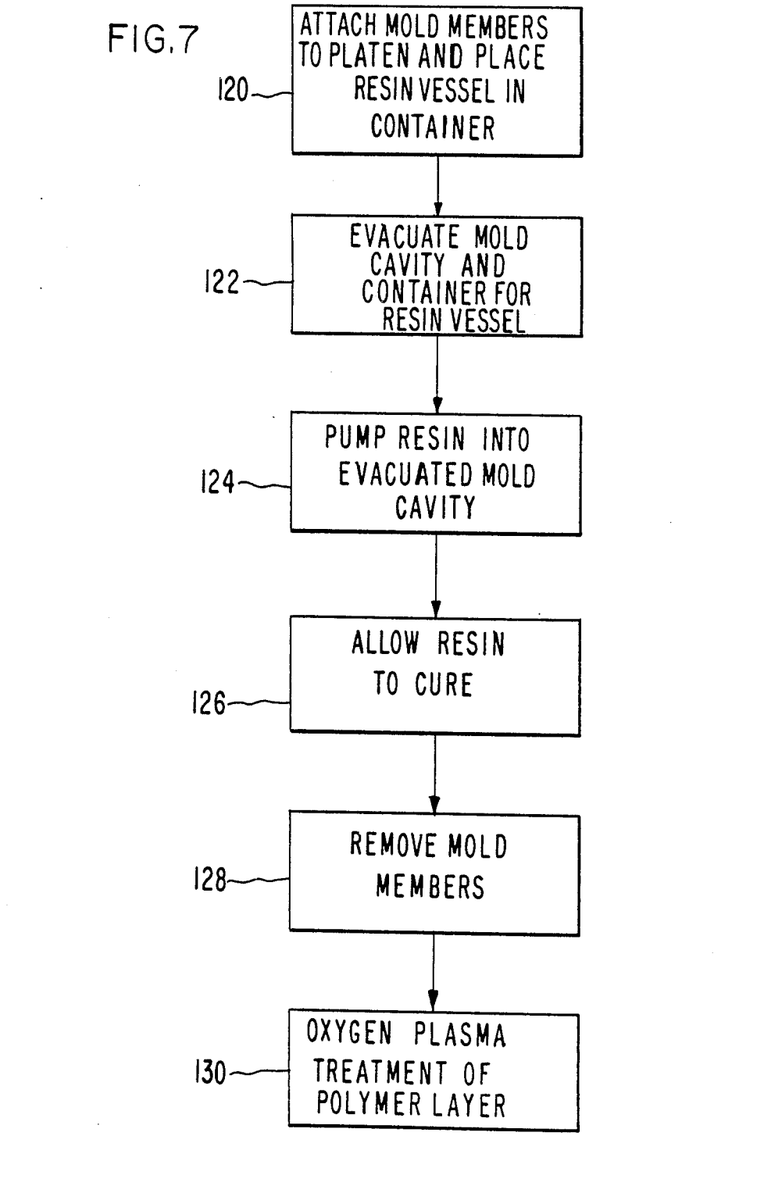
FIG. 7 is a block diagram illustrating the polymer layer fabrication process.

The method for fabricating the polymer layer 30 is summarized in FIG. 7. Initially, gasket 104 and mold member 110 are attached to platen 34 to form mold cavity 114, as indicated in step 120, and resin 88 in vessel 87 is placed in container 76 and cover 78 is sealed thereto. Next, valve 96 is opened, and mold cavity 114 and container 76 are evacuated in step 122. Tube 82 is immersed in resin 88, valve 96 is closed and valve 92 is opened so that pressure source 94 pumps resin into mold cavity 114, as indicated in step 124. The resin is permitted to cure in step 126, and gasket 104 and mold member 110 are removed in step 128. Finally, the platen 34 and polymer layer 30 adhered thereto are subjected to oxygen plasma treatment to form surface film 50 in step 130.

It will be understood that other techniques for forming the surface film 50 are included within the scope of the present invention. For example, deposition of silane gas and oxygen on the silicone rubber surface can be utilized to form the oxide layer. In addition, the surface film can be formed of another smooth, plate-like material such as graphite. Graphite, mechanically deposited and rubbed so as to adhere to the surface of a silicone rubber layer, produces enhanced thermal transfer and does not adhere to wafers. The primary requirement is to provide a thin, smooth and relatively hard surface film on a relatively soft, thermally-conductive polymer layer. The surface film prevents sticking and permits intimate contact with the semiconductor wafer. The soft polymer layer and its surface film both conform to the back surface of the wafer and both have high thermal conductivity so that overall thermal transfer performance is greatly improved. Thermal contact resistances have been measured with the thermal transfer apparatus disclosed herein at about 10° C./watt/$cm^2$. By contrast, a good performance with gas cooling is about 40° C./watt/$cm^2$ and typical performance with prior art polymer layers is about 50°–60° C./watt/$cm^2$.

While there has been shown and described what is at present considered the preferred embodiments of the present invention, it will be obvious to those skilled in the art that various changes and modifications may be made therein without departing from the scope of the invention as defined by the appended claims.

What is claimed is:

1. Apparatus for effecting thermal transfer with a workpiece in vacuum, comprising:
   a thermally-conductive member including a heat transfer surface;
   a first resilient, thermally-conductive layer affixed to said heat transfer surface for conforming to the shape of a surface of said workpiece; and
   a second thermally-conductive layer, thin relative to said first layer, affixed to said first layer and having a smooth surface for contacting said workpiece without adhering thereto.

2. Apparatus as defined in claim 1 wherein said first layer comprises a thermally-conductive polymer layer.

3. Apparatus as defined in claim 2 wherein said polymer layer comprises silicone rubber having thermally-conductive particles dispersed therein.

4. Apparatus as defined in claim 3 wherein said second layer comprises a thin quartz surface film.

5. Apparatus as defined in claim 1 wherein said workpiece comprises a semiconductor wafer.

6. Apparatus as defined in claim 3 wherein said first layer has a durometer value less than about 20 Shore A.

7. Apparatus as defined in claim 4 wherein said quartz surface film comprises a plurality of plates on said polymer layer.

8. Apparatus as defined in claim 4 wherein said quartz surface film has a thickness in the range of 0.1 to 5.0 micrometers.

9. Apparatus as defined in claim 4 wherein said quartz surface film is formed by oxygen plasma treatment of said silicone rubber.

10. Apparatus as defined in claim 1 wherein said heat transfer surface is substantially flat.

11. Apparatus as defined in claim 5 further including means for pressing said wafer firmly into contact with the smooth surface of said second layer.

12. Apparatus as defined in claim 11 wherein said pressing means comprises centrifugal means for pressing said wafer against said second layer without physical contact to the front surface of said wafer.

13. Apparatus as defined in claim 12 wherein said pressing means comprises means for rotating said thermally-conductive member and said first and second layers about a prescribed axis so that said wafer is pressed against said second layer by centrifugal force, and wherein said first and second layers are substantially flat.

14. Apparatus as defined in claim 11 wherein said pressing means comprises means for clamping said wafer at its periphery.

15. Apparatus as defined in claim 1 wherein said second layer comprises a material that is harder than said first layer.

16. Apparatus as defined in claim 15 wherein said second layer has a thickness in the range of 0.1 to 5.0 micrometers.

17. Apparatus as defined in claim 15 wherein said first layer comprises silicone rubber having thermally-conductive particles dispersed therein and wherein said second layer is formed by oxygen plasma treatment of said silicone rubber.

18. Apparatus as defined in claim 15 wherein said second layer is formed by oxygen plasma treatment of said first layer.

19. Apparatus as defined in claim 3 wherein said thermally-conductive particles comprise aluminum oxide having a dimension on the order of 40 micrometers or less.

20. Apparatus as defined in claim 19 wherein said thermally-conductive particles do not protrude substantially above the surface of said second layer.

21. Apparatus for effecting thermal transfer with a semiconductor wafer in vacuum, comprising:
    a thermally-conductive platen including a heat transfer surface; and
    a thermally-conductive silicone rubber layer affixed to said heat transfer surface, said silicone rubber layer having a durometer value less than about 20 Shore A and having a thin surface film which prevents adherence of a semiconductor wafer thereto.

22. Apparatus as defined in claim 21 wherein said surface film comprises a plurality of plates on said silicone rubber layer.

23. Apparatus as defined in claim 21 wherein said surface film has a thickness in the range of 0.1 to 5.0 micrometers.

24. Apparatus as defined in claim 21 wherein said surface film is formed by oxygen plasma treatment of said silicone rubber.

25. Apparatus as defined in claim 24 wherein said surface film comprises quartz.

26. Apparatus as defined in claim 21 wherein said surface film is hard relative to said silicone rubber layer.

27. Apparatus as defined in claim 21 further including
    means for pressing a semiconductor wafer firmly into contact with the surface film on said silicone rubber layer, and
    source means for directing an ion beam at the semiconductor layer pressed onto said silicone rubber layer.

28. Apparatus as defined in claim 27 wherein said pressing means comprises means for rotating said platen and said silicone rubber layer about a prescribed axis so that said wafer is pressed against said silicone rubber layer by centrifugal force, and wherein said silicone rubber layer is substantially flat.

29. Apparatus as defined in claim 27 further including means for cooling said platen.

30. Apparatus as defined in claim 21 wherein said silicone rubber layer has a thickness in the range between 0.001 inch and 0.020 inch.

31. Apparatus as defined in claim 29 wherein said pressing means comprises centrifugal clamping means for pressing said semiconductor wafer against said silicone rubber layer without physical contact to the front surface of the semiconductor wafer so that the wafer is exposed for treatment by said ion beam.

32. Apparatus as defined in claim 31 wherein said heat transfer surface is substantially flat.

33. Apparatus as defined in claim 27 further including a vacuum chamber containing said source means.

34. Apparatus for effecting thermal transfer with a workpiece in vacuum, comprising:
    a thermally-conductive platen including a heat transfer surface;
    a resilient, thermally-conductive polymer layer affixed to said heat transfer surface, said polymer layer having a thin quartz surface film for contacting said workpiece; and
    means for pressing said workpiece firmly into contact with said quartz surface film.

35. Apparatus as defined in claim 34 wherein said polymer layer comprises silicone rubber having thermally-conductive particles dispersed therein.

36. Apparatus as defined in claim 34 wherein said quartz surface film has a thickness in the range of 0.1 to 5.0 micrometers.

37. Apparatus as defined in claim 34 wherein said quartz surface film comprises a plurality of plates on said polymer layer.

38. A method for effecting thermal transfer with a workpiece in vacuum, comprising the steps of:
    providing a thermally-conductive platen including a heat transfer surface;
    affixing a soft, thermally-conductive polymer layer to the heat transfer surface;
    forming on said polymer layer a thin surface film for contacting said workpiece without adhering thereto; and
    pressing the workpiece firmly into contact with the surface film.

39. A method as defined in claim 38 wherein the step of affixing a polymer layer includes the step of affixing a silicone rubber layer having thermally-conductive particles dispersed therein, on said heat transfer surface.

40. A method as defined in claim 39 wherein the step of forming a surface film includes the step of oxygen plasma treatment of said silicone rubber.

41. A method as defined in claim 40 wherein the step of oxygen plasma treatment of said silicone rubber is sufficient to form said surface film of thickness in the range of 0.1 to 5.0 micrometers.

42. A method as defined in claim 39 wherein the step of forming a surface film includes the step of forming a quartz surface film.

43. A method as defined in claim 40 wherein the step of oxygen plasma treatment is performed at an oxygen pressure of about 400 microns and an rf level of about one kilowatt for a time of about 30 minutes.

44. A method as defined in claim 38 further including the step of fracturing said surface film into a plurality of plates.

45. A method as defined in claim 44 wherein the step of fracturing said surface film includes stressing said surface film.

46. Apparatus for effecting thermal transfer with a semiconductor wafer in vacuum, comprising:
    a thermally-conductive platen including a heat transfer surface; and
    a thermally-conductive polymer layer affixed to said heat transfer surface, said polymer layer having a thin surface film for contacting said semiconductor wafer, said surface film being harder than said polymer layer.

47. Apparatus as defined in claim 46 wherein said surface film has a thickness in the range of 0.1 to 5.0 micrometers.

48. Apparatus as defined in claim 47 wherein said polymer layer comprises silicone rubber having thermally-conductive particles dispersed therein.

49. Apparatus as defined in claim 46 wherein said surface film and said polymer layer have a hardness ratio of at least 10:1.

50. Apparatus as defined in claim 46 wherein said polymer layer is at least 50 times thicker than said surface film.

51. Apparatus as defined in claim 49 wherein said polymer layer has a durometer value of 20 Shore A or less.

52. Apparatus as defined in claim 46 wherein said surface film comprises an oxide formed from said polymer layer.

53. A method of treating a thermally-conductive polymer layer used for thermal transfer with a semiconductor wafer to prevent adherence of the wafer to the polymer layer, comprising:
    forming a thin surface film on said polymer layer, said surface film being harder than said polymer layer.

54. A method as defined in claim 53 wherein the step of forming a surface film includes the step of oxygen plasma treatment of said polymer layer.

55. A method as defined in claim 53 wherein said polymer layer comprises silicone rubber and wherein the step of forming a surface film includes the step of oxygen plasma treatment of said silicone rubber layer to form a quartz surface film.

56. A method as defined in claim 53 further including the step of fracturing the surface film into a plurality of plates.

57. A method as defined in claim 56 wherein the step of fracturing said surface film includes stressing said surface film.

58. A method as defined in claim 55 wherein the step of forming a surface film includes forming said surface film to a thickness in the range of 0.1 to 5.0 micrometers.

59. Apparatus for effecting thermal transfer with a workpiece in vacuum, comprising:
    a thermally-conductive base having a heat transfer surface;
    a first thermally-conductive polymer layer affixed to said heat transfer surface; and
    a second thermally-conductive layer over said first layer, said second layer having a smooth surface for contacting said workpiece without adhering thereto.

60. Apparatus as defined in claim 59 wherein said second layer comprises an oxide formed from said polymer layer.

61. Apparatus as defined in claim 59 wherein said second layer comprises graphite mechanically deposited and rubbed on said polymer layer.

* * * * *